United States Patent [19]
Hakey et al.

[11] Patent Number: 6,066,526
[45] Date of Patent: May 23, 2000

[54] METHOD OF MAKING TRENCH DRAM

[75] Inventors: Mark Charles Hakey, Milton, Vt.;
William Hsioh-Lien Ma, Fishkill, N.Y.

[73] Assignee: International Business Machines Corporation, Armonk, Calif.

[21] Appl. No.: 09/012,070

[22] Filed: Jan. 22, 1998

[51] Int. Cl.[7] .............................................. H01L 21/8242
[52] U.S. Cl. .......................................... 438/243; 438/241
[58] Field of Search ................................... 438/241, 243, 438/244, 386, 387, 592

[56] References Cited

U.S. PATENT DOCUMENTS

| | | | |
|---|---|---|---|
| 5,360,758 | 11/1994 | Bronner et al. | 438/243 |
| 5,614,431 | 3/1997 | DeBrosse | 438/243 |

FOREIGN PATENT DOCUMENTS 9-199688  7/1997  Japan .

*Primary Examiner*—Chandra Chaudhari
*Attorney, Agent, or Firm*—Pollock, Vande Sande & Amernick; Joseph P. Abate

[57] ABSTRACT

A process sequence for an eight square folded bit line dynamic random access memory (DRAM) cell allows a transfer device channel length of two lithographic features. The method uses conventional processing techniques with no spacer defined features and uses conventional structures. The process sequence starts with deep trench (DT) processing, followed by deposition of insulator such as $SiO2$, planarization and pad strip. Then gate insulator and gate conductor are deposited. Also a pad or thin insulator can be deposited at this stage. The structure is etched using a shallow trench isolation mask and filled with $SiO_2$. The gate conductor such as polysilicon is etched with a contact mask and reactive ion etching. If not previously deposited, a thin insulator is deposited. The structure is etched again with a gate poly contact mask. A gate conductor is then deposited. After a final etch, wiring is added.

18 Claims, 9 Drawing Sheets

METHOD OF MAKING TRENCH DRAM

TECHNICAL FIELD

The present invention generally relates to integrated circuit dynamic random access memories (DRAMs) and, more particularly, to a process sequence that achieves a reduction of DRAM cell size without a concomitant concern of reducing channel length.

BACKGROUND OF INVENTION

Manufacturing of semiconductor devices is dependent upon the accurate replication of computer aided design (CAD) generated patterns onto the surface of a device substrate. The replication process is typically performed using optical lithography followed by a variety of subtractive (etch), additive (deposition) and material modification (e.g., oxidations, ion implants, and the like) processes. Optical lithography patterning involves the illumination of a metallic coated quartz plate known as a photo mask which contains a magnified image of the computer generated pattern etched into the metallic layer. This illuminated image is reduced in size and patterned into a photosensitive film on the device substrate.

To achieve the required density, 1 Gbit-era DRAMs will require a cell with an area of approximately eight times the lithographic feature size squared. Convention 8 square folded bit line DRAM cells require a transfer device channel length of one lithographic feature. However, this shrinkage also reduces transfer device channel length which is not desirable.

SUMMARY OF INVENTION

It is therefore an object of the present invention to provide a process sequence for an eight square folded bit line DRAM cell allowing a transfer device channel length of two lithographic features. The present invention allows the required shrinkage without a concern in reduction in channel length.

According to the present invention, there is provided a process sequence for an eight square folded bit line DRAM cell allowing a transfer device channel length of two lithographic features. The method uses conventional processing techniques with no spacer defined features and uses conventional structures.

The process sequence of the present invention starts with deep trench (DT) processing, followed by deposition of insulator such as SiO$_2$, planarization and deposition of a pad strip. Next, shallow trench isolation is provided. Then gate insulation gate conductor such as polysilicon is deposited. The structure is etched using a STI mask and reactive ion etching. A thin insulator is deposited and the structure is etched again with a gate contact extension mask. A gate conductor is then deposited. After a final etch, wiring can be added.

An alternative sequence of the present invention starts with deep trench (DT) processing, followed by deposition of insulator such as SiO$_2$, planarization and deposition of a pad strip. Next, shallow trench isolation is provided. Then gate insulation gate conductor such as polysilicon or polysilicon/silicide is deposited. A thin insulator is next deposited. The structure is etched using a STI mask and reactive ion etching. The structure is etched again with a gate poly contact extension mask. A gate conductor is then deposited. After a final etch, wiring can be added.

A still further sequence according to the present invention starts with deep trench (DT) processing, followed by deposition of insulator such as SiO$_2$, planarization and deposition of a pad strip. Next, shallow trench isolation is provided. Then gate insulation gate conductor such as polysilicon or polysilicon/silicide and pad are deposited. The structure is etched using a STI mask and reactive ion etching. A thin insulator is deposited and the structure is etched again with a gate poly contact extension mask. A gate conductor is then deposited. After a final etch, wiring can be added.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The foregoing and other objects, aspects and advantages will be better understood from the following detailed description of a preferred embodiment of the invention with reference to the drawings, in which.

BEST AND VARIOUS MODES FOR CARRYING OUT INVENTION

The following is an outline of the process sequence. Certain steps which are not significant to the invention, such as implant masks, have been omitted and may be inserted as appropriate.

Figure 1:
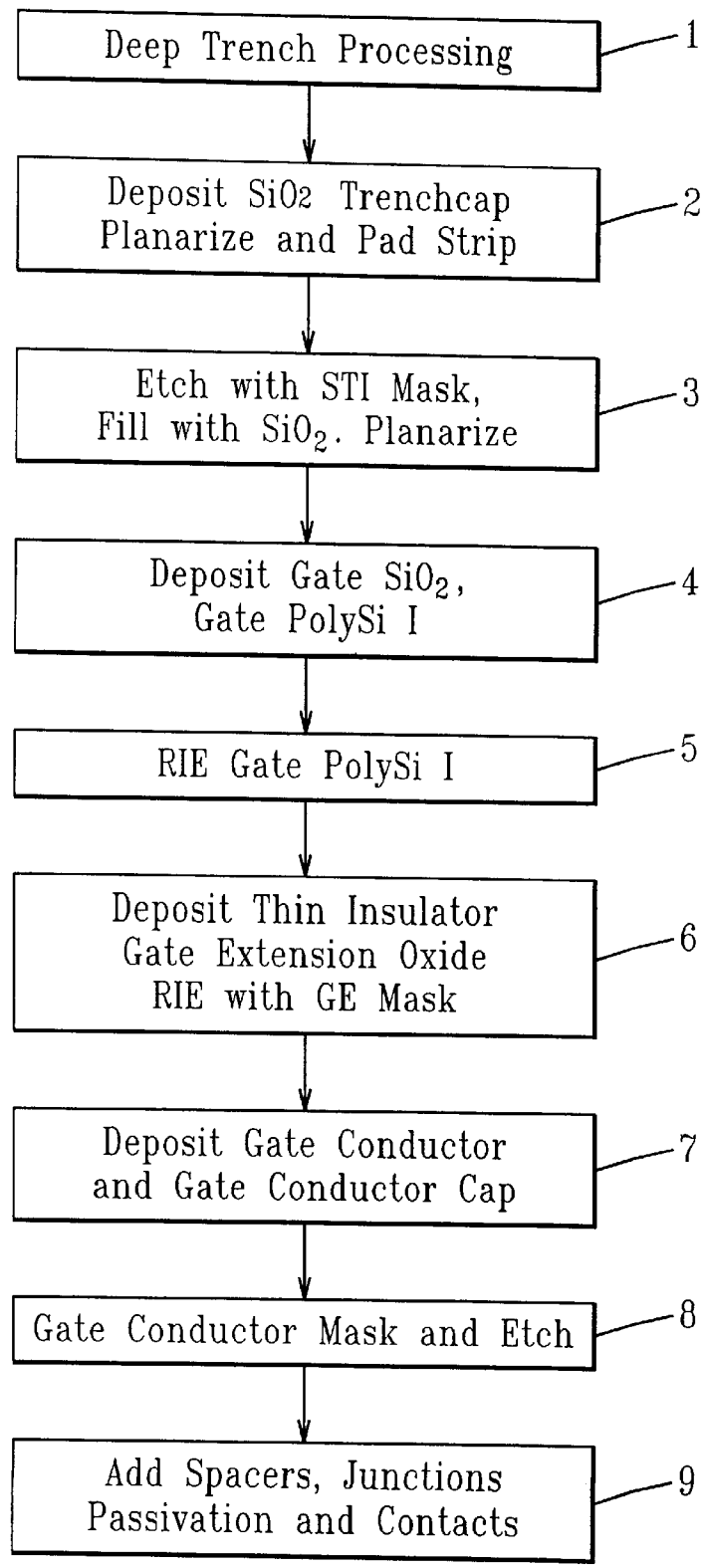
FIG. 1 is a flow chart showing the steps of the invention.

Referring now to the drawings, and more particularly to FIG. 1, there is shown a flow chart showing the steps of the invention. First in block 1, the cell is subject to deep trench (DT) processing. This is accomplished by forming N and P wells followed by depositing a protective layer such as silicon nitride as a polish stop. A trench capacitor is formed by etching a deep trench into the substrate and forming an insulator along the trench surface. The trench is filled with doped polysilicon. The polysilicon is recessed to a first level and an insulating collar is deposited and etched. A second layer of a conductor such as conductive polysilicon or polysilicon/silicide is deposited over the first level and recessed. For the recess, the polysilicon is etched back below the surface to allow formation of the strap.

Figure 2:
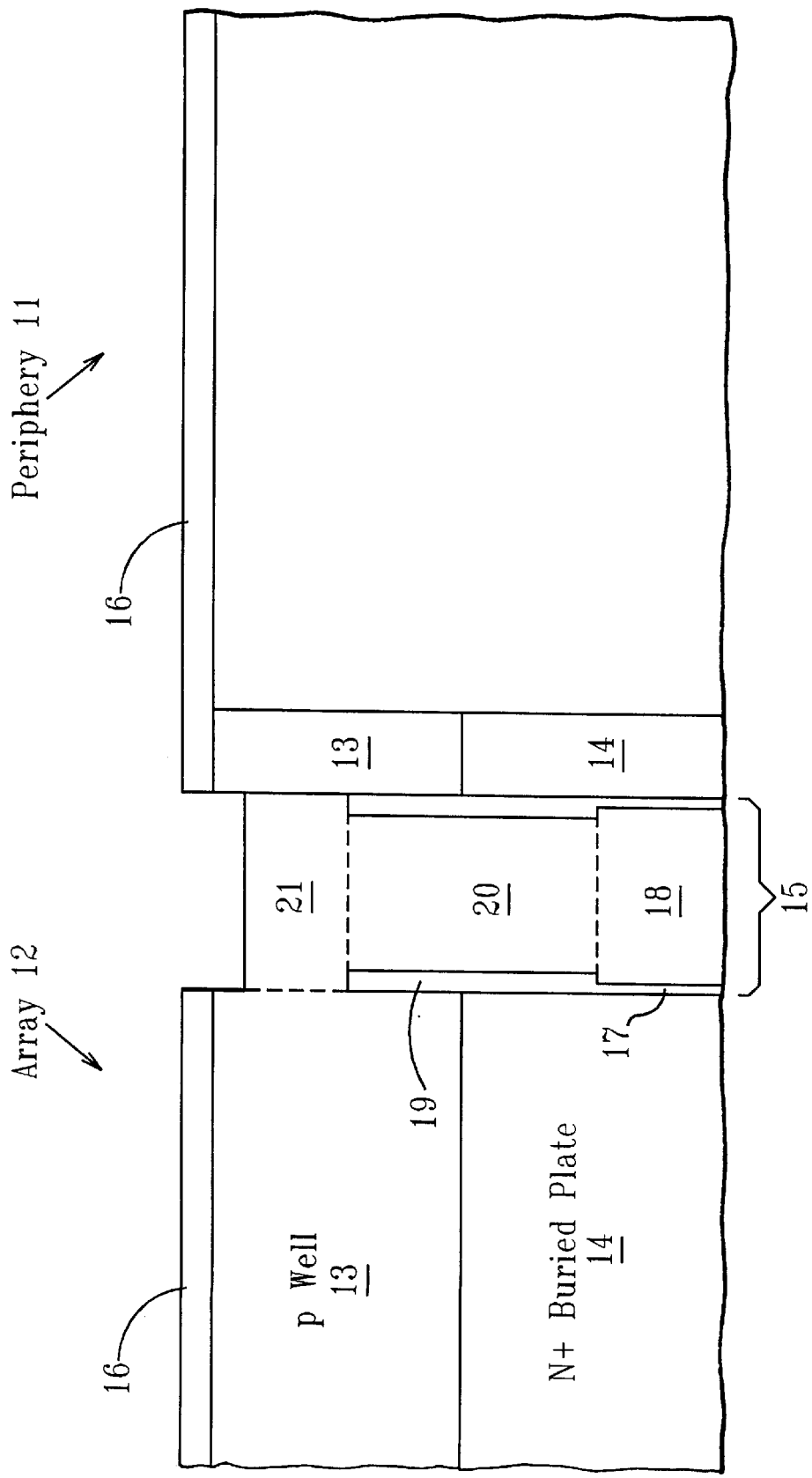
FIG. 2 is a cross-section of a cell structure after deep trench processing.

The structure after this first step is shown in FIG. 2. In FIG. 2, one can see a cross-section of a cell following deep trench processing. There is shown both periphery 11 and array regions 12. In the array region 12, a P well 13 and N+ buried plate 14 surround a trench 15. A pad 16 is deposited over the P well 13. Within the trench 15, there is deposited node dielectric 17 and polysilicon fill 18. The collar 19 and a second polysilicon fill 20 fills the next region of the trench 15. Strap polysilicon 21 has been deposited in the top layer of the trench 15.

Figure 3:
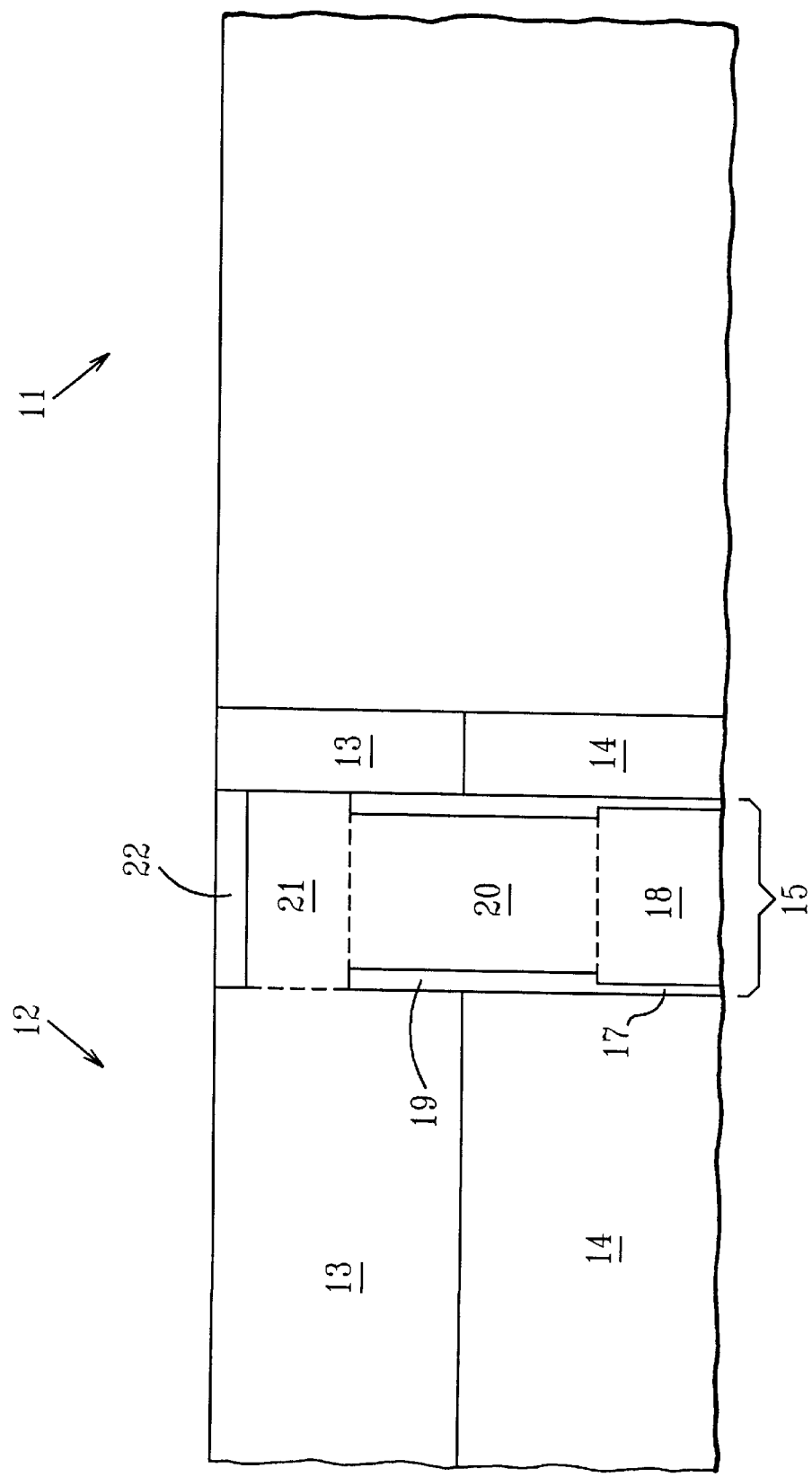
FIG. 3 is a cross-section of a cell structure after SiO$_2$ trench cap deposition, planarization, and pad strip.

Returning to FIG. 1, next, as shown in block 2, trench cap deposition of insulating layer such as $SiO_2$, planarization, and pad strip occurs. The structure after this step is shown in FIG. 3. In FIG. 3, a trench cap 22 such as $SiO_2$ has been deposited in the trench 15 over the polysilicon 21. After the deposition of trench cap 22, the trench cap 22 is planarized and the pad 16 is removed. Then the cell is etched with a shallow trench isolation mask and filled with insulator such as $SiO_2$ as in step 3 of FIG. 1.

Figure 4:
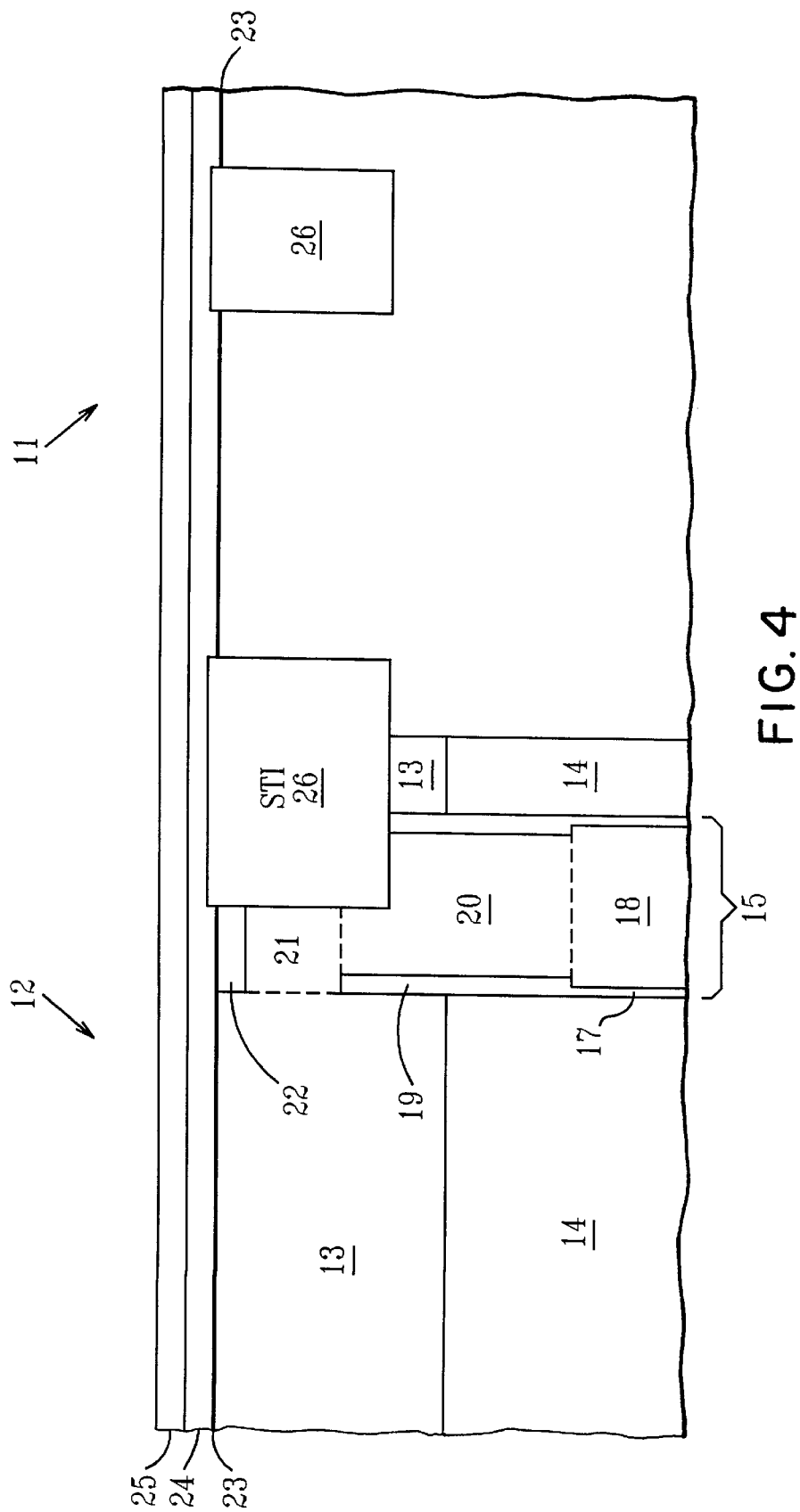
FIG. 4 is a cross-section of a cell structure after shallow trench isolation and deposition of gate polysilicon I.
Figure 5:
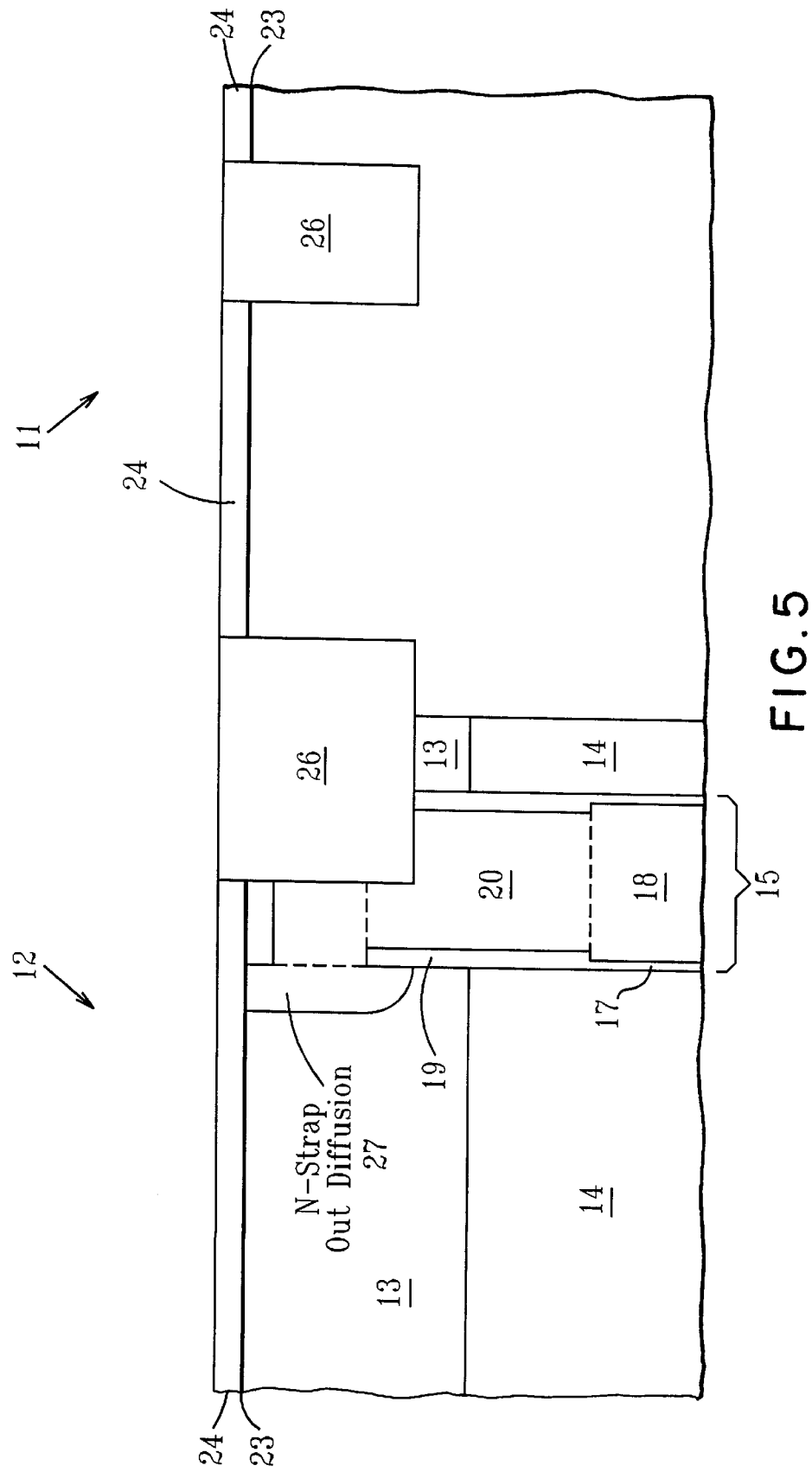
FIG. 5 is a cross-section of a cell structure after gate poly I etch.

In the fourth step shown in block 4 of FIG. 1, gate insulator such as $SiO_2$, silicon nitride or silicon oxynitride; gate conductor such as gate poly silicon; and insulator pad are deposited. The pad 25 is optional and not required for masking purposes at this stage. The pad 25, when employed, is typically about 2000 Å to about 10,000 Å. A typical insulator pad material is silicon dioxide. In FIG. 4, gate insulator 23 such as $SiO_2$ and gate polysilicon 24 have been deposited. A new pad 25, if desired, covers the entire structure. In the fifth step, shown in block 5 of FIG. 1, the first polysilicon 24 is etched stopping on the gate insulator 23 using a modified STI mask and reactive ion etching. The pad 25, if used, is stripped. The result is shown in FIG. 5.

Figure 6:
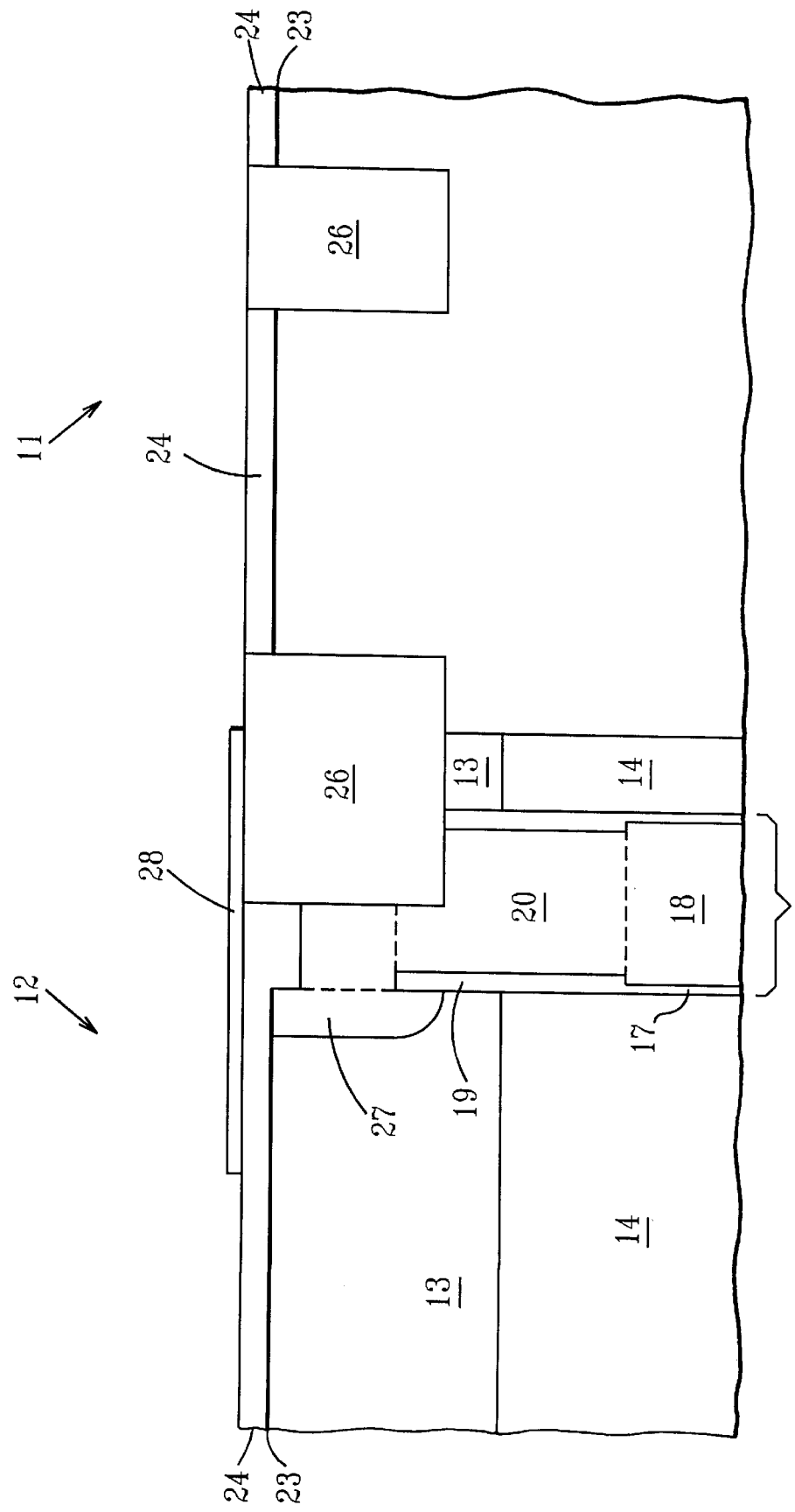
FIG. 6 is a cross-section of a cell structure after thin insulator deposition and gate insulator extension, and gate extension etch.

In the step shown in block 6 of FIG. 1, thin insulator, typically about 10–70 nm thick (50 nm $SiO_2$), is deposited, and etched with a gate poly contact (GPC) (gate extension) mask using RIE. In FIG. 6, a thin insulator 28 has been deposited and etched. The GPC mask is designed so as to remove the thin insulator 28 completely from the peripheral regions, allowing the formation of standard CMOS structures. In the array, the GPC mask is designed so as to remove the thin insulator 28 from a square region measuring approximately two lithographic features per edge and centered over what will become the bit line contact.

Figure 7:
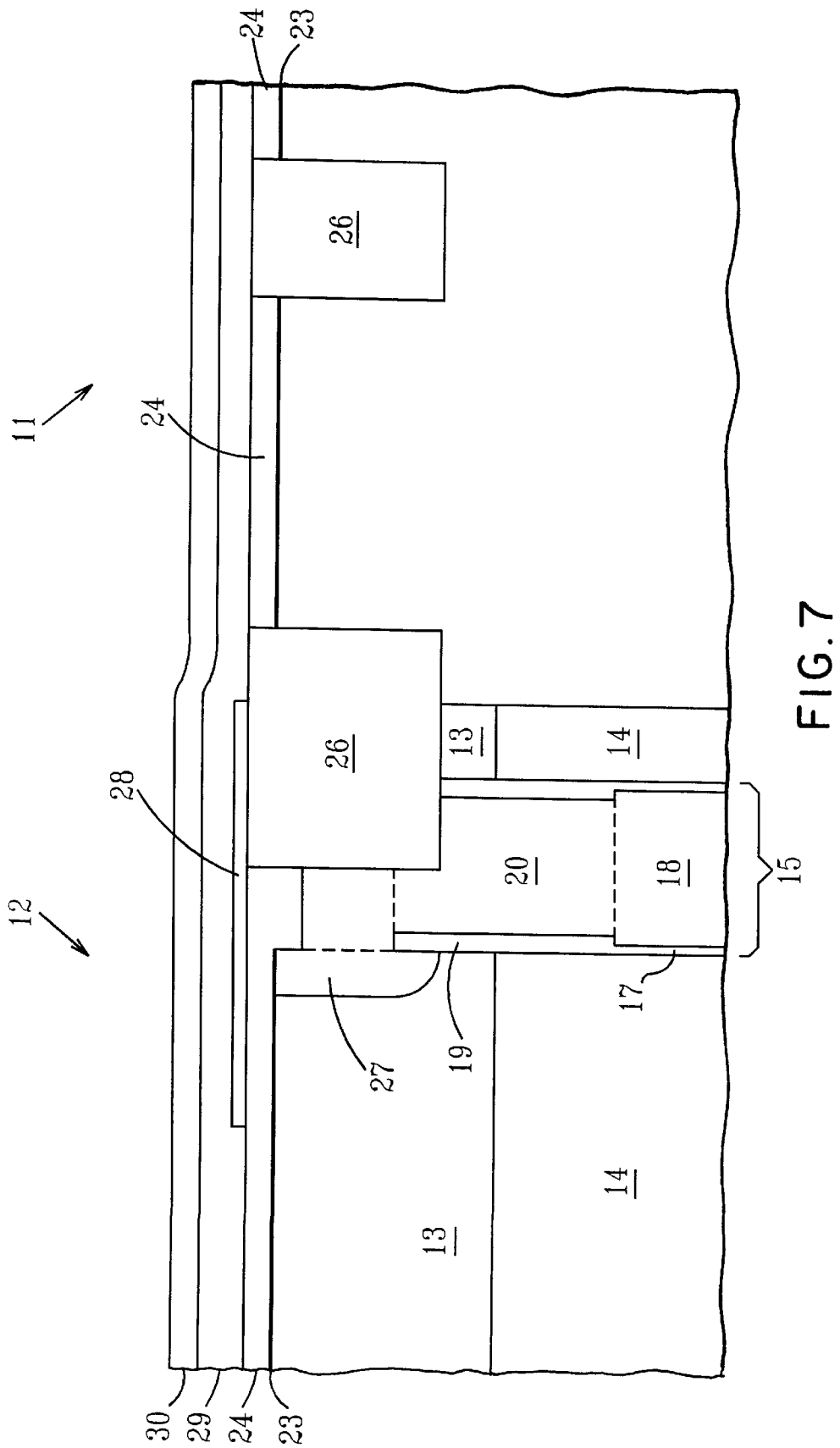
FIG. 7 is a cross-section of a cell structure after gate conductor and gate cap depositions.

In the seventh step shown in block 7 of FIG. 1, the gate conductor (GC, polysilicon, or $WSi_x$) and the GC cap (e.g. $Si_3N_4$) are deposited. The seventh step is illustrated in FIG. 7. Gate conductor 29 and gate conductor cap 30 have been deposited. The surface of the array is now higher than that of the peripheral region by roughly the thickness of thin insulator 28 (30 nm). This thickness is chosen to be thin enough so as not to cause difficulties in subsequent processing.

Figure 8:
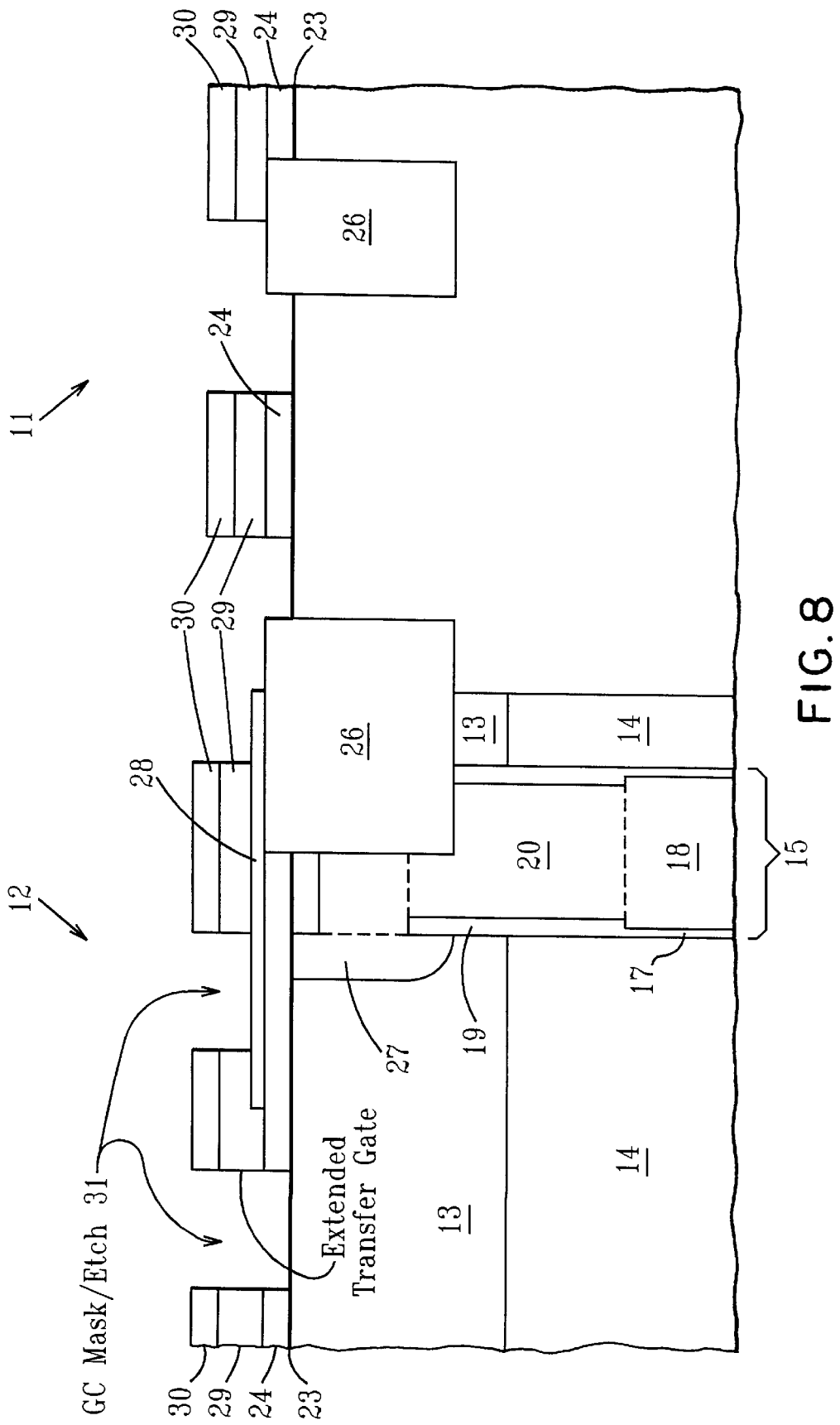
FIG. 8 is a cross-section of a cell structure after gate conductor mask and etch.

In the eighth step shown in block 8 of FIG. 1, the gate conductor is etched using the GC mask and RIE. This is shown in FIG. 8. First the gate conductor cap 30 is etched using the GC mask. The masking photoresist is then removed and the gate conductor 29 and gate polysilicon 24 are etched selectively to $Si_3N_4$ and $SiO_2$. In different areas of the structure, this etch stops on the gate cap 30, gate insulator 23, thin insulator 28 or STI fill 26.

Figure 9:
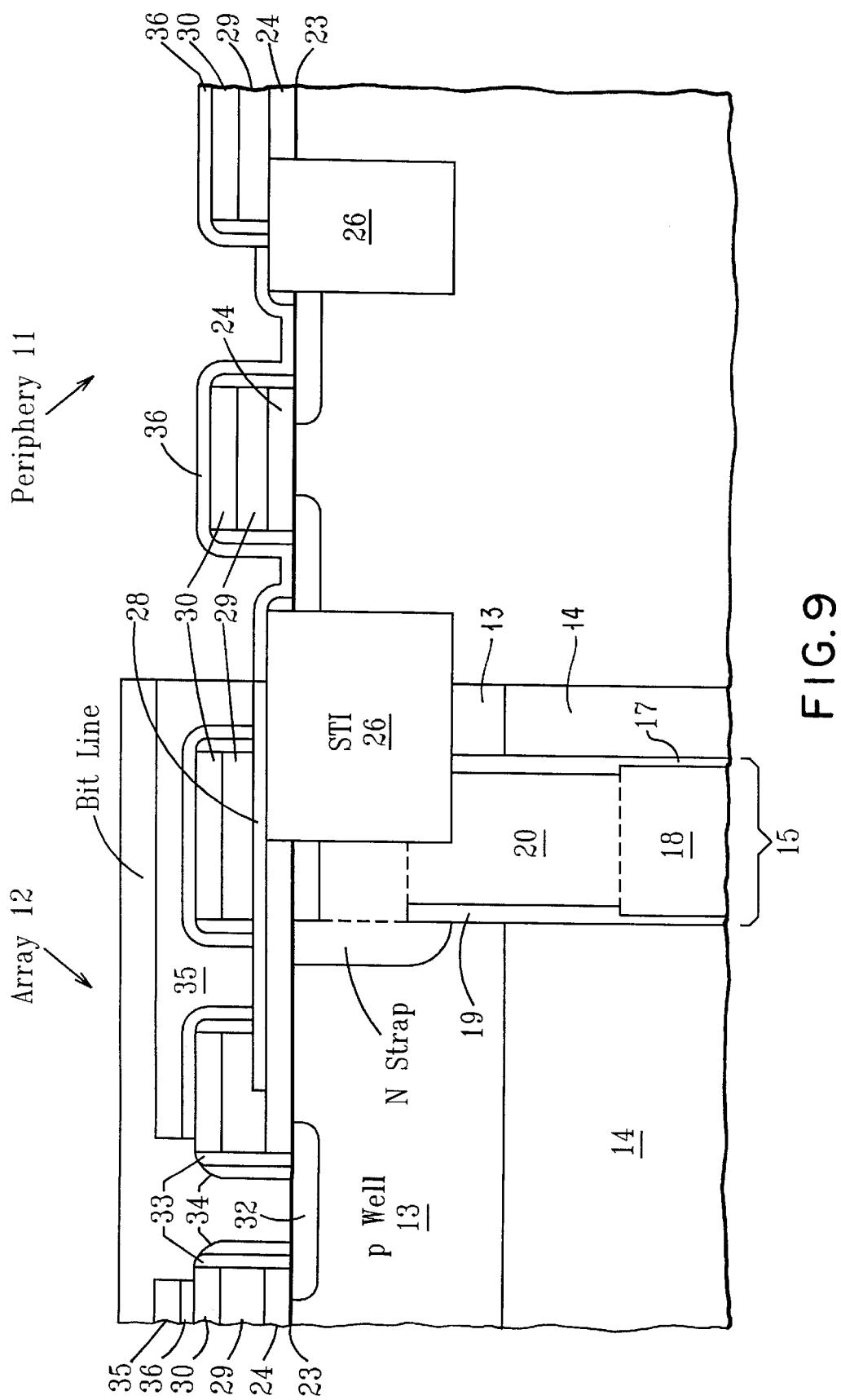
FIG. 9 is a cross-section of a cell structure after spacers, junctions, passivation, contacts and wiring.

The final step shown in block 9 is to add spacers, junctions, passivation, and contacts. This is shown in FIG. 9. A spacer 33 such as of $SiO_2/Si_3N_4$ is built on the sidewall of the gate. Source/drain diffusions 32 are formed by implant/diffusion. A passivation/etch stop layer (e.g. $Si_3N_4$) 36 and first insulator (e.g. $SiO_2$) 35 are deposited. The bit line contact opening is etched through this first insulator 35, stopping on the passivation/etch stop layer 36. This passivation/etch stop layer is then etched, allowing contact to the bit line contact diffusion 32 and leaving an additional spacer 34 of sidewall in the bit line contact opening.

Advantages of the process of the present invention include the ability to define the gate by well known and controllable lithography and reactive ion etching and defining the gate poly thickness by deposition. These features are advantageous over prior techniques including those disclosed in U.S. Pat. No. 5,614,431. For instance, the fourth embodiment in U.S. Pat. No. 5,614,431 requires a significantly thicker STI oxide for planarizing the gate polysilicon. The present invention uses lithography for defining the STI, gate conductor and gate poly. Also in the fourth embodiment referred to, the gate poly thickness is defined by STI planarization and gate poly planarization processes. The planarization processes create the possibility of adding defects to the gate in the form of residues, scratches and the like. These defects can, in turn, negatively impact upon the gate performance.

In an alternative process according to the present invention, the process sequence is the same as discussed above through the fourth step. In the fourth step, the pad 25 is not used and instead the thin insulator 28 is deposited immediately after depositing gate conductor 24 rather than later on in the step shown in block 6 of FIG. 1. The process sequence then continues in the same sequence as discussed above except in the step shown in block 6, a thin insulator 28 need not be deposited since it has already been provided in a previous step.

The present invention provides an easier and more controllable process along with assuring well defined gate and poly thicknesses.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of manufacturing a memory cell structure comprising the steps of:

provided a cell prepared with a trench, isolation regions and active area regions, wherein said active area regions are covered with insulator and pad strip;

then etching using a shallow trench isolation mask;

then depositing insulator fill;

then providing gate insulator and gate conductor;

then etching said gate conductor with a modified STI mask and reactive ion etching;

then depositing a thin insulator;

then etching said thin insulator with a gate contact extension mask;

then depositing a gate conductor and a gate conductor cap; and then etching said gate conductor cap and gate conductor with a gate conductor mask.

2. The method of claim 1 wherein said gate conductor comprises conductive polysilicon or conductive polysilicon/silicide.

3. The method of claim 1 wherein said insulator fill comprises silicon dioxide.

4. The method of claim 1 wherein said thin insulator comprises silicon dioxide.

5. The method of claim 1 wherein said gate conductor cap comprises silicon nitride.

6. The method of claim 1 which further comprises adding spacers, junctions, passivation contacts and wiring after etching said gate conductor cap and gate conductor.

7. A method of manufacturing a memory cell structure comprising the steps of:

providing a cell prepared with a trench, isolation regions and active area regions, wherein said active area regions are covered with insulator and pad strip;

then etching using a shallow trench isolation mask;

then depositing insulator fill;

then providing gate insulator and gate conductor;

then depositing a thin insulator;

then etching said gate conductor with a modified STI mask and reactive ion etching;

then etching said thin insulator with a gate contact extension mask;

then depositing a gate conductor and a gate conductor cap; and then etching said gate conductor cap and gate conductor with a gate conductor mask.

8. The method of claim 7 wherein said gate conductor comprises conductive polysilicon or conductive polysilicon/silicide.

9. The method of claim 7 wherein said insulator fill comprises silicon dioxide.

10. The method of claim 7 wherein said thin insulator comprises silicon dioxide.

11. The method of claim 7 wherein said gate conductor cap comprises silicon nitride.

12. The method of claim 7 which further comprises adding spacers, junctions, passivation contacts and wiring after etching said gate conductor cap and gate conductor.

13. A method of manufacturing a memory cell structure comprising the steps of:

providing a cell prepared with a trench, isolation regions and active area regions, wherein said active area regions are covered with insulator and pad strip;

then etching using a shallow trench isolation mask;

then depositing insulator fill;

then providing gate insulator, and gate conductor and pad;

then etching said gate conductor and pad with a modified STI mask and reactive ion etching:

then depositing a thin insulator;

then etching said thin insulator with a gate contact extension mask;

then depositing a gate conductor and a gate conductor cap; and then etching said gate conductor cap and gate conductor with a gate conductor mask.

14. The method of claim 13 wherein said gate conductor comprises conductive polysilicon or conductive polysilicon/silicide.

15. The method of claim 13 wherein said insulator fill comprises silicon dioxide.

16. The method of claim 13 wherein said thin insulator comprises silicon dioxide.

17. The method of claim 13 wherein said gate conductor cap comprises silicon nitride.

18. The method of claim 13 which further comprises adding spacers, junctions, passivation contacts and wiring after etching said gate conductor cap and gate conductor.

* * * * *